United States Patent
Klassen et al.

(10) Patent No.: US 11,067,964 B2
(45) Date of Patent: Jul. 20, 2021

(54) METHOD TO IMPROVE PERFORMANCE, MANUFACTURING, AND DESIGN OF A SATELLITE ANTENNA

(71) Applicant: Kymeta Corporation, Redmond, WA (US)

(72) Inventors: Paul Klassen, Newcastle, WA (US); Jonas Nicholson, Preston, WA (US); Benjamin Ash, Seattle, WA (US); Mark Johnson, Oak Harbor, WA (US)

(73) Assignee: KYMETA CORPORATION, Redmond, WA (US)

( * ) Notice: Subject to any disclaimer, the term of this patent is extended or adjusted under 35 U.S.C. 154(b) by 148 days.

(21) Appl. No.: 16/249,839

(22) Filed: Jan. 16, 2019

(65) Prior Publication Data

US 2019/0219982 A1 Jul. 18, 2019

Related U.S. Application Data

(60) Provisional application No. 62/618,490, filed on Jan. 17, 2018.

(51) Int. Cl.
*G05B 19/406* (2006.01)
*G06N 20/00* (2019.01)
(Continued)

(52) U.S. Cl.
CPC ..... *G05B 19/406* (2013.01); *G06F 16/90335* (2019.01); *G06N 20/00* (2019.01); *G05B 2219/32366* (2013.01)

(58) Field of Classification Search
CPC ......... G06F 16/24561; G06F 16/90335; G05B 19/41875; G05B 2219/32187; G05B 2219/32366
(Continued)

(56) References Cited

U.S. PATENT DOCUMENTS 7,987,449 B1 7/2011 Marolia et al.
8,555,273 B1 10/2013 Chia et al.
(Continued)

FOREIGN PATENT DOCUMENTS

KR 10-2014-0039380 4/2014

OTHER PUBLICATIONS

International Preliminary Report on Patentability for Application No. PCT/US2019/013988 dated Jul. 30, 2020, 6 pages.
(Continued)

*Primary Examiner* — Michael J Brown
(74) *Attorney, Agent, or Firm* — Womble Bond Dickinson (US) LLP

(57) ABSTRACT

System and methods are disclosed for improving manufacturing processes, improving manufactured products, and improving deployed devices. The devices can be reconfigurable holographic antennas ("antennas"). Manufacturing test results for a plurality of antennas is collected. Field performance data and antenna management information is collected for a plurality of deployed antennas. Query selection criteria, machine learning correlation criteria and a minimum correlation threshold are passed to a server to query for matching records from a data store and to perform machine learning on the query results to generate improvements to processes, manufactured antenna performance and deployed antenna performance.

15 Claims, 12 Drawing Sheets

(51) Int. Cl.
  *G06F 16/903* (2019.01)
  *G06F 16/24* (2019.01)
  *G06F 16/90* (2019.01)

(58) Field of Classification Search
  USPC .......................................................... 700/108
  See application file for complete search history.

(56) References Cited

U.S. PATENT DOCUMENTS

2013/0151447 A1    6/2013  Kaushal et al.
2015/0030165 A1    1/2015  Risberg et al.
2016/0139974 A1*   5/2016  Herb .................... H04W 24/00
                                                        714/37

OTHER PUBLICATIONS

International Search Report for Application No. PCT/US2019/013988 filed on Apr. 9, 2020. 4 pages.

* cited by examiner

METHOD TO IMPROVE PERFORMANCE, MANUFACTURING, AND DESIGN OF A SATELLITE ANTENNA

RELATED APPLICATIONS

This application claims priority of U.S. Provisional Patent Application Ser. No. 62/618,490, entitled "METHOD TO IMPROVE PERFORMANCE, MANUFACTURING, AND DESIGN OF SATELLITE ANTENNA," to Paul Klassen et al., filed Jan. 17, 2018, and is hereby incorporated by reference in its entirety to the extent that it is consistent with this patent application.

TECHNICAL FIELD

Embodiments of the present disclosure relate generally to improving manufacturing processes, improving manufactured products, and improving deployed products, including reconfigurable holographic satellite antennas.

BACKGROUND

The cost of manufacturing and testing technically complex electronic devices can be very high. In addition, the time that it takes during manufacturing to perform the necessary testing can affect manufacturing throughput. The cost of designing, purchasing, and maintaining specialized testing equipment, and training personnel to use the testing equipment, can also be very high. Such testing ensures that a manufactured product meets minimum product specifications at the time that the electronic device leaves the factory. However, such testing does not account for aging of subsystems of the electronic device or differing environmental conditions in which each electronic device may be used. Further, later developed improvements to the electronic device, such as one or more updated configuration parameters, updated software, patches, and the like, may be difficult deploy once an electronic device has left the factory. In addition, it is often difficult to determine the effectiveness of such updates upon one or more devices that takes into account the manufacturing history of the electronic devices.

A satellite communication device, such as a steerable satellite antenna, may only have access to a high-latency, unreliable network connection, and no access to a ground-based network connection having high speed and reliability. Unlike a conventional computing device, a user of the satellite communication device may not be available to assist in the updating of the operating software and configuration of the satellite device. The satellite communication device may also have operating parameters or configuration that are unique to a particular satellite device. The operating parameters or configuration may also need to be updated occasionally, due to a physical environment of the satellite communication device, or aging of the satellite communication device, and without the assistance of a user of the satellite communication device.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Figure 1:
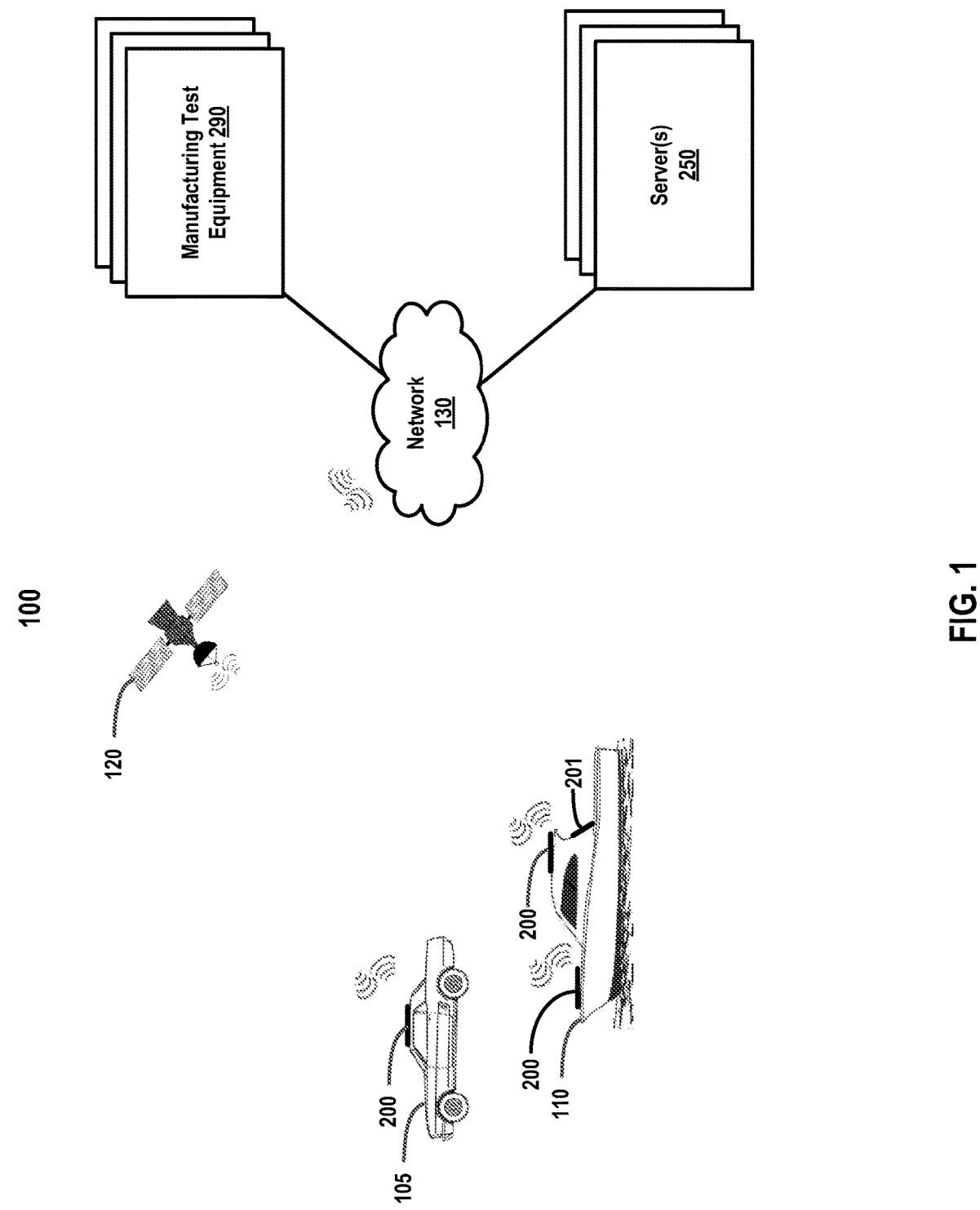
FIG. 1 is a block diagram illustrating a satellite-based network for managing and updating an antenna subsystem module of a reconfigurable holographic antenna, according to one embodiment of the disclosure.

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

A method and apparatus are disclosed for leveraging production performance data to improve the manufacturing and antenna design. The techniques disclosed herein use production performance data to improve the manufacturing and design of satellite antennas. As part of the process, in one embodiment, the production performance data is associated with sub-segment improvements. In one embodiment, sub-segment performance is correlated with satellite antenna life-cycle and longevity. Also, in one embodiment, the design process is improved by correlating environmental factors to satellite antenna performance over-time.

More specifically, using the manufacturing test data and production performance data, improvements in manufacturing processes, antenna software improvements and overall antenna design can be obtained. That is, by correlating device traits with live performance results, problems can be deduced. Based on those deduced problems, improvements to performance, antenna design, and manufacturability can be implemented.

In one embodiment, the manufacturing test data and production performance data is collected automatically. For example, the test data may be sent automatically from one or more pieces of test equipment to a database. The production performance data may also be sent to the database. Processing logic (e.g., a processor, server, etc.) may be employed to determine correlations that help direct changes in the antenna design.

In one embodiment, machine learning is used to automate changes to the antenna design based on the collected manufacturing test data and the production performance data. While the enclosed embodiments are described with reference to an antenna subsystem module and the holographic pattern of a reconfigurable holographic antenna, the embodiments are equally applicable to virtually any type of electronic device that is improved by updating software and/or configuration information within the electronic device and within the manufacturing test processes.

In an embodiment, a computer-implemented method for improving a process of manufacturing an electronic device, or improving the electronic device, includes receiving selection criteria for querying a database of configuration and performance information of a plurality of electronic devices and receiving correlation criteria for performing machine learning on query results returned from the database. In response to receiving query results matching the selection criteria, the method performs machine learning on the query results according to the correlation criteria. A proposed improvement is received, the improvement being related to a process of manufacturing an electronic device, or a proposed improvement to an electronic device. The improvement is deployed to an electronic device. In an embodiment, the database includes configuration and performance data of a plurality of manufactured devices and a plurality of deployed devices. In an embodiment, the configuration and performance data of deployed devices is updated in response to updating the deployed devices. In an embodiment, the proposed improvement is received from a computing device executing the machine learning, in response to the correlation of the received query results to the correlation criteria being greater than the minimum correlation threshold. The query results can include both manufacturing testing information and field update information for each of one or more electronic devices. The query results can include changes to performance information for each of one or more electronic devices over a specified period of time. The correlation criteria can include a minimum correlation threshold indicating an effectiveness of one or more updates or changes to configuration of the plurality of electronic devices. In an embodiment, the correlation criteria can include a proposed improvement that is to be deployed in the event that the minimum correlation criteria is met or exceeded.

In an embodiment, any of the above method operations can be performed by a processing system having at least one hardware processor, and a memory programmed with executable instructions that, when executed by the processing system, perform the operations of the methods.

In an embodiment, any of the above method operations can be implemented with executable instructions programmed onto a non-transitory computer readable medium, such as a memory or storage. When the executable instructions are executed by a processing system having at least one hardware processor, the processing system causes the method operations to be performed.

FIG. 1 is a block diagram illustrating a satellite-based network 100 for managing the manufacturing and updating of an antenna subsystem module and the holographic pattern of a reconfigurable holographic antenna according to one embodiment of the disclosure.

A satellite-based network 100 can include, e.g. one or more reconfigurable holographic antennas each having an antenna subsystem module (hereafter, "steerable antenna") 200. A steerable antenna 200 is an electronic device capable of bi-directional communication with a satellite 120. The steerable antenna 200 can be installed on a vehicle, such as a car 105 or boat 110, or other mobile installation. A steerable antenna 200 can also be installed in a fixed location, such as on a building, in place of, or in addition to, a land-based communication system.

An installation can have one or more steerable antennas 200, as shown on boat 110. Multiple steerable antennas 200 in a single installation can improve signal performance based upon location of the steerable antenna 200 in the installation, such as different locations having different visibility to one or more satellites. The multiple steerable antennas 200 can be interconnected using a combiner 201, as shown on boat 110. In an embodiment, combiner 201 can initiate bi-directional communication with satellite 120 through one or more connected antennas 200. In an embodiment, combiner 201 can select one or more of the steerable antennas 200 connected to combiner 201 to initiate communication with satellite 120.

The satellite-based network 100 can also include one or more servers 250 that can serve updates of software, configuration information, and other information to manage steerable antennas 200 in the satellite-based network 100. Servers 250 can also store information regarding each steerable antenna 200 in the satellite-based network 100, in association with a unique identifier of each steerable antenna 200. Server(s) 250 can include a machine learning system that utilizes both manufacturing testing data and historic information of updates and software, configuration parameters, and other data on one or more deployed antennas. Server(s) 250 can store detailed information of the entire lifecycle of deployed antennas.

The satellite-based network 100 can also include one or more manufacturing test equipment stations 290 that can interact with servers 250. As an antenna is manufactured, the antenna is put through a series of manufacturing (or quality) tests to ensure conformance of components of the antenna, and the finished antenna, to design specifications. Data collected, both as inputs and outputs, to test processes can be stored in server(s) 250 in association with a unique serial number of each antenna 200 or combiner 201. Servers 250 can be any kind of servers or a cluster of servers, such as Web or cloud servers, application servers, backend servers, or a combination thereof. Servers 250 can include data analytics servers that can perform machine learning on data retrieved from steerable antennas 200 to determine the existence of problems, based upon correlation of collected. The solutions can be used to improve performance for one or more steerable antennas 200, such as with a new software update, patch, hot fix, configuration, algorithm, or tunable parameter of one or more steerable antennas 200.

Network 130 may be any type of network such as a local area network (LAN), a wide area network (WAN) such as the Internet, a cellular network, a satellite network, or a combination thereof, wired or wireless.

Figure 2A:
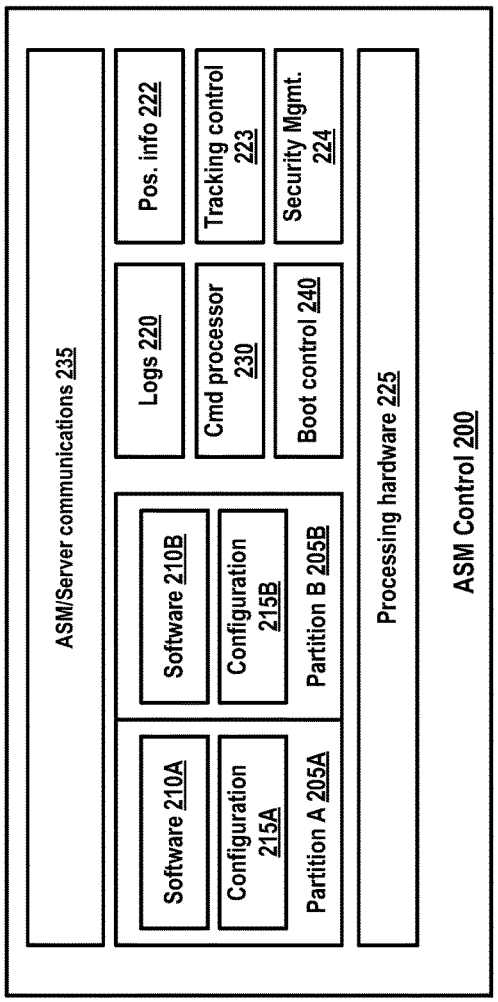
FIG. 2A is a block diagram illustrating components of an antenna subsystem module for a reconfigurable holographic antenna according to one embodiment.

FIG. 2A is a block diagram illustrating components of an antenna subsystem module (ASM) of a steerable antenna 200 according to one embodiment. In the description below, reference 200 will be used to refer to both the ASM and the steerable antenna (reconfigurable holographic antenna), interchangeably, unless a distinction is required for clarity.

ASM 200 can include at least two storage partitions: partition A 205A and partition B 205B. ASM 200 can also include processing hardware 225, log files 220, position information module 222, tracking control module 223, security management 224, command processing logic (or, command processor) 230, ASM/Server communications 235, and boot control logic 240.

Processing hardware 225 can include one or more hardware processors interconnected with memory, storage, one or more timers, and communications hardware via a bus. Exemplary processing hardware is described below with reference to FIG. 11. Storage can include two or more storage partitions, partition A 205A and partition 205B. Each of the partitions can include operating software, e.g. software 210A for partition 205A, and configuration information, e.g. configuration 215A for partition 205A. When the ASM 200 boots, boot control module 240 can control which partition, 205A or 205B, that the ASM 200 boots to.

For example, software 210A in partition 205A may be an older version of software than 210B in partition 210B. Software 210B can be, e.g. an update that was just installed into partition B. After completion of the installation of updated software 210B, boot control 240 can reboot the ASM 200 to partition 205B to use software 210B. If software 210B fails to boot a predetermined number of times, then boot control module 240 can reboot again to partition 205A to use software 210A.

Similarly, configuration information 215A in partition 205A may be an older version of configuration data than 215B. Configuration information 215B can be, e.g., an update that was just installed into partition 205B. After completion of the installation of updated configuration information 215B, boot control 240 can reboot the ASM 200 to partition 205B to use configuration information 215B. During rebooting to partition 205B, a power-on-self-test (POST) can be performed and logs can be generated indicating start-up performance of the ASM 200 using the updated configuration information 215B. In addition, one or more performance monitors in software 210B can be used to determine whether the updated configuration information 215B yields improved performance over configuration information 215A. If performance is not improved, boot control 240 can reboot to the previous partition 205A to use the previous configuration information 215A.

In an embodiment, updating the configuration information, e.g. 215A, can be performed in the same partition, e.g. 205A so that rebooting to a different partition is not needed to activate the updated configuration information. Thus, one partition can hold multiple copies of configuration information. Boot control 240 can store a reference to the currently active partition and currently active configuration such that boot control 240 can "hot-swap" between multiple versions of the configuration in a partition to compare performance of each copy of configuration information.

ASM control 200 can further include a command processor 230. Command processor 230 can receive a package of information from server 250. Command processor can decrypt the received package and verify that the package was successfully downloaded by computing a checksum of the decrypted package and comparing the checksum with a stored checksum in the package. Encryption of the package can be by symmetric key or asymmetric key encryption. In an embodiment using asymmetric key encryption, such as public key infrastructure (PKI), the package is encrypted by server 250 using a public key of the ASM 200, and then transmitted to the ASM 200. The ASM 200 decrypts the package using private key of the ASM 200. In an embodiment, each package transmitted by the server 250 and received by the ASM 200 may include a digital signature of the server 250 that is verifiable by the ASM 200 and/or a security certificate of the server 250, verifiable by a third party certificate service.

Command processor 230 can parse the received, decrypted and verified package from the server 250 to extract one or more commands from the server for the ASM 200 to perform, and to extract associated parameters, values, or other data from the package. Commands can include, but are not limited to, a command informing the ASM 200 that a software update is available, a command informing the ASM 200 that one or more updated parameters that may improve ASM 200 performance are available, a command instructing the ASM 200 to reset one or more parameters of the ASM 200 that were altered by manual optimization by the user, a command to set, or clear, a variable indicating that the ASM 200 should request an update to software, and a command to enter a debug mode, log output of the debug mode, and transmit the debug log(s) to the server 250. Logs 220 can include the debug logs. Logs 220 can also include logging of information during regular operation of the ASM 200, including environmental temperature and humidity of an area surrounding the ASM, temperature of one or more segments of the steerable antenna, power-on-self-test information, partition information, such as which partition is the currently active partition, the software version in the currently active partition, file sizes in the partitions, serial number of the steerable antenna, control variables of different operating processes of the steerable antenna and antenna subsystem module, quality metrics of antenna performance, and other data. Position information module 222 can manage information regarding location tracking of the ASM 200 and reconfigurable holographic antenna with respect to, e.g., a GPS satellite, to assist in beam steering. Tracking control module 223 can track one or more satellites with which the reconfigurable holographic antenna 200 may communicate. Tracking control module 223 can cooperate with position information module 222 to provide information for beam steering by the reconfigurable holographic antenna. Security management module 224 can assist ASM/Service communications 235 to setup and maintain secure communication channels. Security management module 224 can also implement security over portions of memory, login credentials, and implementation of encrypted and signed data transfer ASM 200 can further include an ASM-to-Server (ASM/Server) communication module 235. ASM/Server communications 235 can initiate a Mutual Transport Layer Security (TLS) connection between the ASM 200 and server 250. The connection is secured using asymmetric key cryptography to encrypt data transmitted using keys that are mutually authorized by both the ASM 200 and server 250. The identity of the communicating parties (ASM 200 and Server 250) can be optionally authenticated using public-key infrastructure (asymmetric key) cryptography.

Figure 2B:
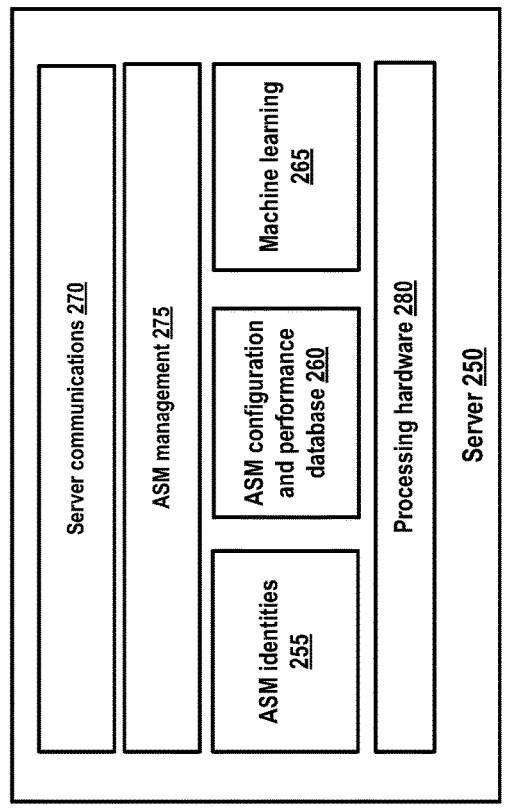
FIG. 2B is a block diagram illustrating components of a server that stores manufacturing data, updates and configuration information of deployed devices, and implements machine learning to generate improvements for manufacturing, configuring, or updating an antenna subsystem module and the holographic pattern for a reconfigurable holographic antenna according to one embodiment.

FIG. 2B is a block diagram illustrating components of a server 250 that stores manufacturing data and updates to deployed devices. Server 250 manages, updates, and learns improvements for manufacturing and configuring or updating an antenna subsystem module for a reconfigurable holographic antenna according to one embodiment.

Server 250 can include server communication module 270. Server 250 can communicate with manufacturing test equipment 290 to receive results of manufacturing tests and data collected during manufacturing tests for each antenna 200 or combiner 201. Server communications 270 can respond to an ASM 200 request for initiating a Transport Layer Security (TLS) connection between the ASM 200 and server 250, and negotiate the connection as described above for ASM 200.

Server 250 can also include ASM management software 275, a database of ASM identities of ASM's 200, a database of ASM configuration and performance information 260 for each ASM 200 having an identity in ASM identities 255, and processing hardware 280. Database 260 can include manufacturing test results and data collected during manufacturing testing, and can include updates to software and configuration parameters of deployed devices, such as antennas 200 and combiners 201.

ASM management software 275 receives periodic "check-ins" from each ASM 200 that is configured to "check-in" with server 250 periodically. In an embodiment, the check-in increment is one hour, but is configurable to any time period. During an ASM 200 check-in, an ASM sends a metrics package to the server 250. In an embodiment, the metrics data can be preceded by, or accompanied by, a header indicating, e.g., a serial number of the ASM and reconfigurable holographic antenna, a software version and an active partition running on the ASM, details of a file system on the ASM, and other data. In an embodiment, the metrics data can comprise a file. The ASM header includes a serial number of the ASM 200, a currently active partition indication including the currently active software version and configuration parameters of the steerable antenna. The metrics package can include power-on self-test (POST) results, temperature and humidity of the environment where the ASM is installed, and temperature of each segment of the steerable antenna. The metrics package can further include file system information, such as a current file size of each file, list of files in a partition, and the like. ASM management 275 receives, decrypts, and stores the metrics package in ASM configuration and performance database 260. ASM management 275 then inspects ASM configuration and performance database 260 to determine: (1) whether there is a update to the ASM 200 software available, (2) whether there is a debug or diagnostic request pending for the ASM, (3) whether there are updated configuration parameters for the ASM 200 that can be installed, or (4) whether one or more configuration parameters have been manually optimized by a user, and the manual optimization resulted in poorer performance and should be reset to previous configuration parameters.

Software Updating

When ASM management 275 receives the metrics package from the ASM 200, ASM management 275 extracts the serial number of the ASM 200 and the software version of the currently active partition. ASM management 275 looks up, in ASM configuration and performance database 260, whether there is an updated version of software that is applicable to this particular ASM 200. If so, then ASM management 275, uses ASM 200's serial number to lookup, in ASM configuration and performance database 260, a number of times that this ASM 200 has previously attempted to previous install this particular version of updated software. If the previous attempts number is greater than zero, then ASM management 275 has determined that this ASM 200 has previously tried to install this update of software and rebooting to this updated version of software was unsuccessful on this ASM 200. Alternatively, or in addition, ASM management 275 can determine that the software installed on the currently active partition of this ASM 200 is outdated, and that the software installed in the other, non-active, partition is the same version as the updated software that the ASM management 275 proposes to tell the ASM 200 to install. If the number of retries (failed reboots with the new software) is less than a predetermined maximum number of times, e.g. three times, ASM management 275 will send a command to ASM 200 to request the updated software for installation. If the number or retries is the maximum number or more than the maximum number, then ASM management 275 can send a command to ASM 200 to stop requesting the updated software, and can further set a flag in ASM configuration and performance database 260 that this ASM 200 has not been able to successfully install this software update. A technician may access ASM configuration and performance database 260 via ASM management 275 to diagnose why the installation of the software update was unsuccessful.

Debug or Diagnostic

A technician, who may have been in communication with a user of the steerable antenna 200, can access server 250 ASM performance and configuration database 260 via ASM management 275, using the serial number of the ASM 200, to determine an action to help resolve a problem for the user. In an embodiment, the technician can instruct ASM management 275 to send a command to ASM 200 to enter a debugging mode than may have a more verbose logging of specific information that may help the technician resolve the problem. ASM management 275 accesses the ASM configuration and performance database 260 to retrieve the debugging command, and transmits the command to ASM 200 to execute. In response, ASM 200 will execute the command, perform the requested logging, and ASM management 275 will receive and store the logs generated by the debug command in ASM configuration and performance database 260, and the debugging mode will end. The technician can retrieve and inspect the logs, and further determine how to resolve the problem. In an embodiment, the technician can inform the server 250 that on next check-in by the ASM 200, that server 250 can tell the ASM 200 to request a "hot-fix" or "patch" intended to resolve the problem. ASM management 275 can send the hot-fix or patch to ASM configuration and performance database 260 for storage. ASM management 275 can either store the hot-fix or patch in association with the serial number of the ASM 200 to be patched, or store the hot-fix or patch in a dedicated storage area and store a reference to the hot-fix or patch in association with the serial number of the ASM 200.

Update Parameters

When ASM management 275 receives the metrics package from the ASM 200, ASM management 275 extracts the serial number of the ASM 200 and the currently active configuration parameters for the ASM 200. The package received from ASM 200 can contain headers and data in any format agreed upon between the ASM 200 and server 250. In an embodiment, a header in the package contains a serial number uniquely identifying the ASM 200 and associated reconfigurable holographic antenna. ASM management 275 looks up, in ASM configuration and performance database 260, whether there is an updated version of one or more configuration parameters that is applicable to this particular ASM 200. If so, then ASM management 275 sends a command to ASM 200 to request the updated configuration parameters. When ASM management 275 receives the request from ASM 200, ASM management 275 can generate a package with the command to install the updated configuration parameters and data containing the updated configuration parameters.

Reset Manually Optimized Parameters

Some or all of the configuration parameters of ASM 200 can be manually optimized through ASM 200 self-optimization software. It is possible that self-optimization may change one or more configuration parameters, but that the result may be that the ASM 200 performance is lower than before the manual self-optimization process on the ASM 200. When ASM management 275 receives a periodic check-in package from ASM 200, ASM management 275 can extract the serial number of the ASM 200, performance metrics, and configuration parameters from the package, and use the serial number to look up pervious configuration parameters and performance metrics for this ASM 200 that are stored in ASM configuration and performance database 260. If ASM management 275 determines that performance of ASM 200 was better with the previously stored configuration parameters, or with factory configuration parameters installed in the ASM 200 when it was shipped, then ASM management 275 can send a package with a command to install new configuration parameters that are included in the package with the command. Alternatively, ASM management 275 can send a command to the ASM 200 to request reset of configuration parameters that were changed due to manual optimization.

Server 250 can also include a machine learning module 265. Machine learning module 265 can receive criteria, e.g. from a technician via ASM management 275, with which to perform machine learning upon selected data stored in the ASM configuration and performance database 260. For example, a technician or engineer may have received notice from one or more users that the reception in a certain geo-location is poor at certain times of day. Machine learning 265 can receive a request to perform machine learning upon data selected from ASM configuration and performance 260 that correlates performance of a steerable antenna to a specified geo-location and time of day. This may help locate regions with poor satellite coverage at certain times of day, and help define the bounds of the region. As a second example, machine learning 265 can receive a request to correlate manually self-optimized configurations with performance to determine whether a self-optimization algorithm is performing its intended function of improving performance. A request can include selection criteria for devices meeting specified performance or configuration criteria, and the request can include correlation criteria with which to perform machine learning. The request can further include a minimum correlation threshold for determining that the selected records meet or exceed the specified correlation threshold. In an embodiment, the selection and correlation criteria can further include a proposed improvement to deploy should the minimum correlation threshold be met or exceeded. Alternatively, or in addition, the results of any machine learning task can be reported to an appropriate entity, such as engineer, manufacturing, or quality control, regardless of whether the minimum correlation threshold was met.

Figure 3:
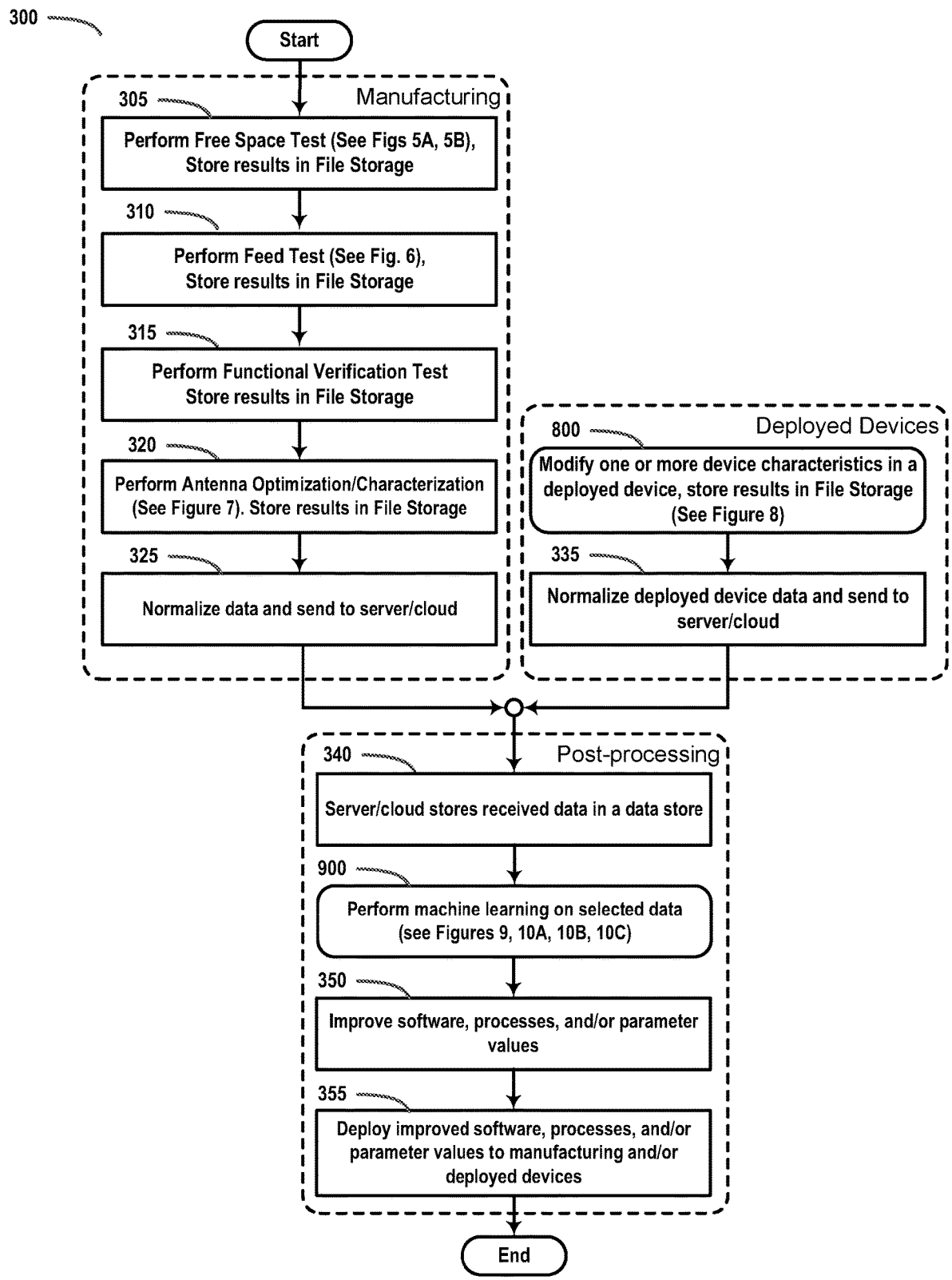
FIG. 3 illustrates an overview of a method that can be practiced on a server for improving manufacturing, updating, and configuring a steering module and the holographic pattern for a reconfigurable holographic antenna, according to an embodiment.

FIG. 3 illustrates an overview of a method 300 that can be practiced on a server for improving manufacturing, updating, and configuring of an antenna subsystem module for a reconfigurable holographic antenna, according to an embodiment Method 300 represents a high-level overview of a data collection and post-processing process that includes collecting manufacturing test information, including inputs, outputs, and interim data, and also collecting historical information about deployed devices, including updates to software, configuration parameters, or other data. Data for each manufactured and/or deployed device is tracked via unique serial number of the device.

In operation 305, a manufacturing "free space test" is performed on a segment before the segment is incorporated into an aperture. The free space test uses radio frequency (RF) emission and manufacturing test equipment 290 to determine the frequency and peak magnitude, in decibels (dB), of two resonant signals in an antenna segment. The free space test is described below with reference to FIGS. 5A and 5B. Inputs, outputs, and interim data are stored in a server 250 storage. In an embodiment data can be stored as comma-separated values (CSVs). Different segments are "binned" (grouped) according to a frequency of the two resonant peaks being within a frequency tolerance for each bin. When a tested segment is associated with an antenna, test data of the segment will be tracked with the antenna.

In operation 310, manufacturing "feed test" is performed on a feed of antenna, before the antenna is assembled. The feed test uses RF emission and a network analyzer as manufacturing test equipment 290 to determine the return loss in the feed of the antenna, both in the feed cavity and at the feed insertion point. The feed test is described below with reference to FIG. 6. Inputs, outputs, and interim data are stored in server 250 storage. In an embodiment, data can be stored as comma-separated values. When the feed is incorporated into an antenna, test data of the feed will be tracked with the antenna by the antenna serial number.

In operation 315, manufacturing "functional verification test" is performed. The functional verification test is performed on an antenna assembled from tested segments and a tested feed. The functional verification test, as its name implies, tests that the antenna 200 meets its design functions within design specification tolerances. Inputs, outputs, and interim data are stored in server 250 storage in association with the antenna 200 serial number. Inputs can include on/off signals to various components, a command to set to a certain frequency, return GPS coordinates, set a heater control value, testing of processor command 230 functionality, testing of internal self-optimization logic, testing of boot control 240 logic, log generation and retrieval, file partition consistency, etc. Outputs can include GPS accuracy, frequency generated vs. frequency requested, heater voltage feedback, etc.

In operation 320, the antenna is optimized and characterized. Manufacturing test equipment 290, and/or ASM 200 logic, can include optimization routines that can optimize the voltage patterns applied to patches in the antenna to steer the beam of the reconfigurable holographic antenna, at a specified frequency. The optimization and characterization test is described below with reference to FIG. 7. Inputs, outputs, voltage patterns, and interim data are stored in server 250 in association with antenna 200 serial number. Data can be stored as comma-separated values.

In operation 325, the manufacturing test data of operations 305 through 320 can be normalized and transmitted to server 250. Server 250 can be a cloud-based server.

Data collected from deployed devices is described beginning with operation 800. Each time that a deployed device receives any management function or service, the function or service is logged in a server 250 storage. A function or service can include receiving a software update, receiving a software patch, receiving one or more new operating parameters or configuration parameters, receiving a command to enter a debug mode, and logging the results of the debug operation, and the like. An antenna 200 receives one or more commands from a management server, e.g. server 250. Operation 800 is described below with reference to FIG. 8.

In operation 335, data stored for antennas 200 as a result of one or more functions or services from a management server 250 can be normalized and transmitted to a server 250. Server 250 can be a cloud-based server.

Post-processing of stored data includes selecting records from a database of manufacturing records and deployed device management records. In operation 340, a server 250 can receive the normalized manufacturing data of operation 325 and the normalized deployed device management data of operation 335 and store the received data in a data store. In an embodiment, the data store can be ASM configuration and performance database 260.

In operation 900, server 250 can use machine learning module 265 to perform machine learning upon a subset of records retrieved from the data store according to specified selection criteria. Machine learning uses specified correlation criteria and a minimum correlation threshold to determine whether the selected records correlate to the correlation criteria at least to the minimum correlation threshold amount. Operation 900 is described below with reference to FIGS. 9, and 10A through 10C. Query selection criteria and correlation criteria can also include a proposed improvement that is proposed for deployment in response to the query results correlating to the correlation criteria to at least the minimum correlation threshold amount.

In operation 350, an improvement can be determined for a software, a manufacturing process, and/or configuration or operating parameter of an antenna 200 based upon the machine learning. In an embodiment, the improvement can be generated by the machine learning module 265, as specified in the query and correlation criteria of operation 900. In an embodiment, the improvement can be received from engineering, manufacturing, and/or quality control personnel.

In operation 355, the improvement can be deployed as updated software, a software patch, an updated manufacturing process, an improved algorithm for a manufacturing test and/or deployed device, and/or updated configuration or operating parameters for a manufactured or deployed antenna 200.

Figure 4A:
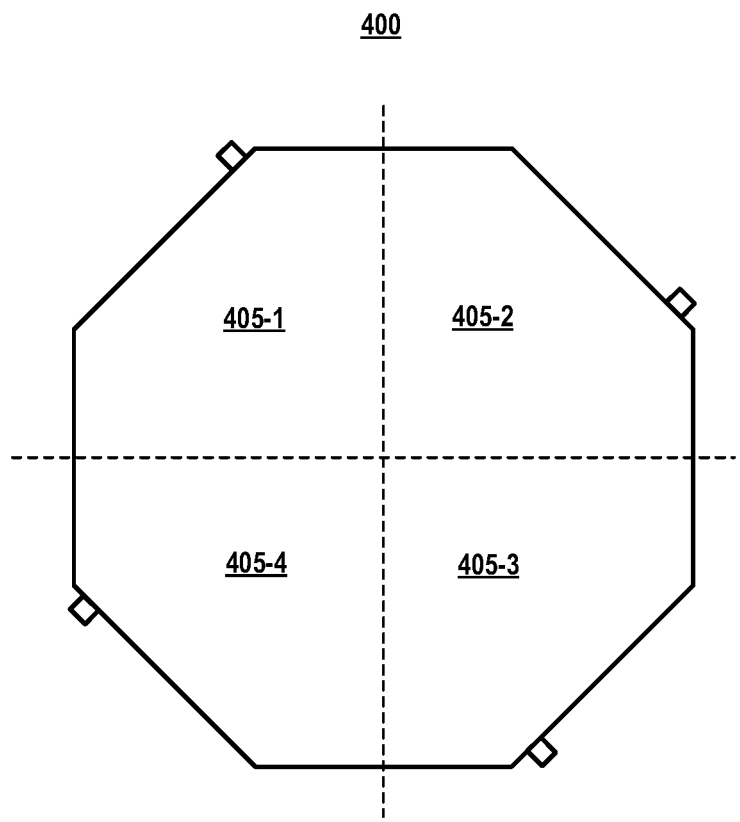
FIGS. 4A and 4B are block diagrams illustrating main components of a reconfigurable holographic antenna, according to one embodiment.
Figure 4B:
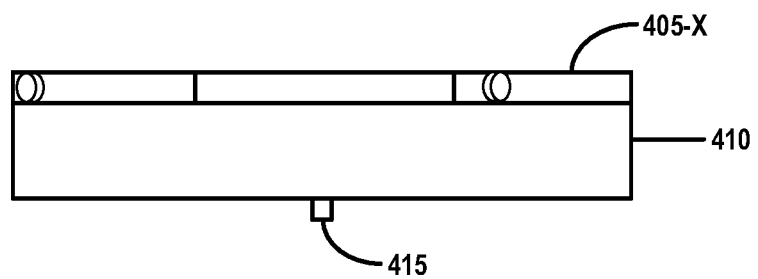

FIGS. 4A and 4B are block diagrams 400 illustrating main components of a reconfigurable holographic antenna, according to one embodiment. FIG. 4A is a top view of four antenna segments (405-1, 405-2, 405-3, 405-4, generically 405-X), arranged as they would be in an assembled antenna 200. Each of the four segments will have been tested before being assembled into an aperture and installed in a feed 410. FIG. 4B illustrates a side view of antenna segments positioned into a feed 410 as they would be during assembly of the antenna. A feed insertion point, or feed launch adapter, is labeled 415.

Figure 5A:
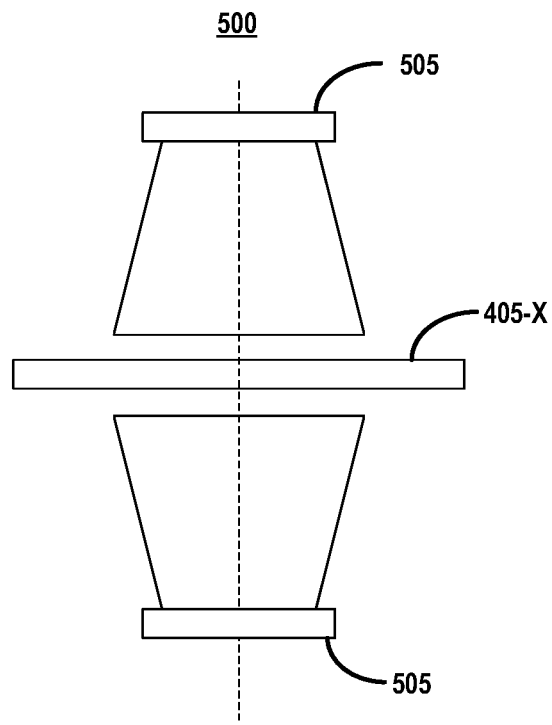
FIG. 5A is a block diagram illustrating components of manufacturing test equipment of a reconfigurable holographic antenna, according to one embodiment.
Figure 5B:
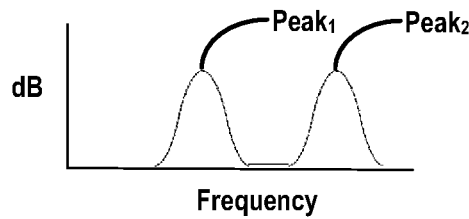
FIG. 5B illustrates an example output from the manufacturing test of FIG. 5A.

FIG. 5A is a block diagram 500 illustrating components of manufacturing test equipment 290 for performing the free space manufacturing test of a segment 405-X to be incorporated into a reconfigurable holographic antenna, according to one embodiment. Each segment 405-X is tested for two peak resonant frequencies before incorporating the segment into an antenna. Emission horns 505 can emit broadband RF radiation toward segment 405-X. Segment 405-X is, initially, not powered on. An oscilloscope or network analyzer can be connected to the segment to determine the two peak resonant frequencies of the segment, labeled $Peak_1$ and $Peak_2$ in FIG. 5B. The frequency of $Peak_1$, and its associated decibel (dB) level and $Peak_2$, and its associated dB level, are stored in server 250 storage. The frequencies of the two peak resonant frequencies may vary slightly from one segment to another due to manufacturing tolerances on physical materials that make up the segments. After testing, segments are "binned" (grouped) together according to $Peak_1$ and $Peak_2$, within an acceptance tolerance, so that segments having very similar resonant peaks are used together in an antenna.

After the passive (power off) peak resonant frequencies are determined, the segment is powered on. The peaks will shift according to the operation of the antenna. The shifted $Peak_1$, and associated dB value, and the shifted $Peak_2$, and associated dB value, are stored in server 250 storage. The power to the segment is then turned off, and the peaks will shift back to their previous resonance values. The frequencies and dB values of the two peaks are again recorded to server 250 storage.

Figure 6:
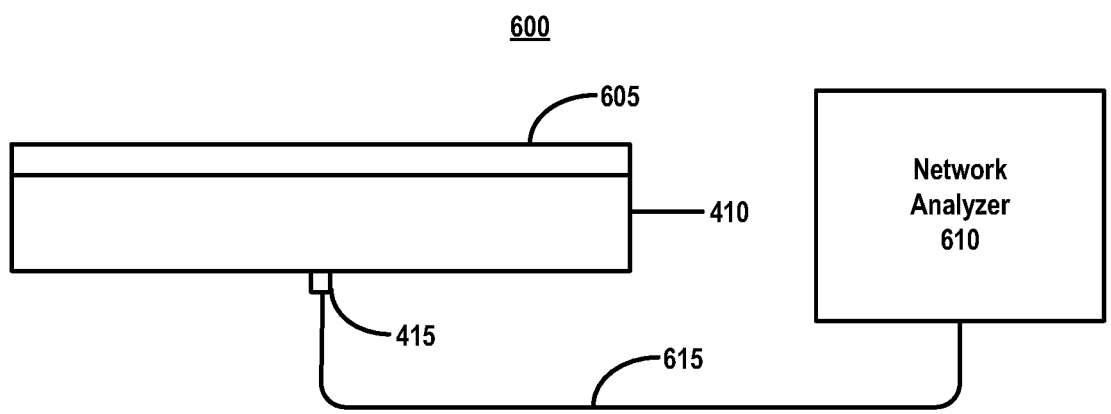
FIG. 6 is a block diagram illustrating components of manufacturing test equipment of a reconfigurable holographic antenna, according to one embodiment.

FIG. 6 is a block diagram 600 illustrating components of manufacturing test equipment 290 for a feed test of a reconfigurable holographic antenna, according to one embodiment. Feed 410 is a machined metal cavity, such as an aluminum cavity, with a feed insertion point 415. When assembled, the feed 410 will receive an antenna aperture having multiple tested segments 405-X. For the feed test, the feed 410 will be fitted with a machined plate 605 to cover the top of the feed 410. Feed insertion point 415 will be coupled 615 to a network analyzer 610 to perform the feed test.

A first test will determine the return loss of the feed 410. For each set frequency, from 11.4 GHz to 14.5 GHz, in increments of 0.1 GHz (100 MHz), network analyzer 610 injects RF into the feed insertion point 415 at the set frequency. Network analyzer 610 measures a return loss of the feed 410. Each set frequency and return loss value is stored in server 250 storage. In an embodiment, the feed 410 return loss specification requirement for the feed 410 is less than −10 dB.

A second test will determine the return loss of the feed insertion point 415. For each set frequency, from 11.4 GHz to 14.5 GHz, in increments of 0.1 GHz (100 MHz), network analyzer 610 injects RF at the set frequency for a short burst, such as 4 or 5 millisecond (ms). Network analyzer 610 measures a return loss of the feed insertion point 415. Each set frequency and return loss value is stored in server 250 storage. In an embodiment, the feed insertion point 415 return loss specification requirement is less than −15 dB.

Figure 7:
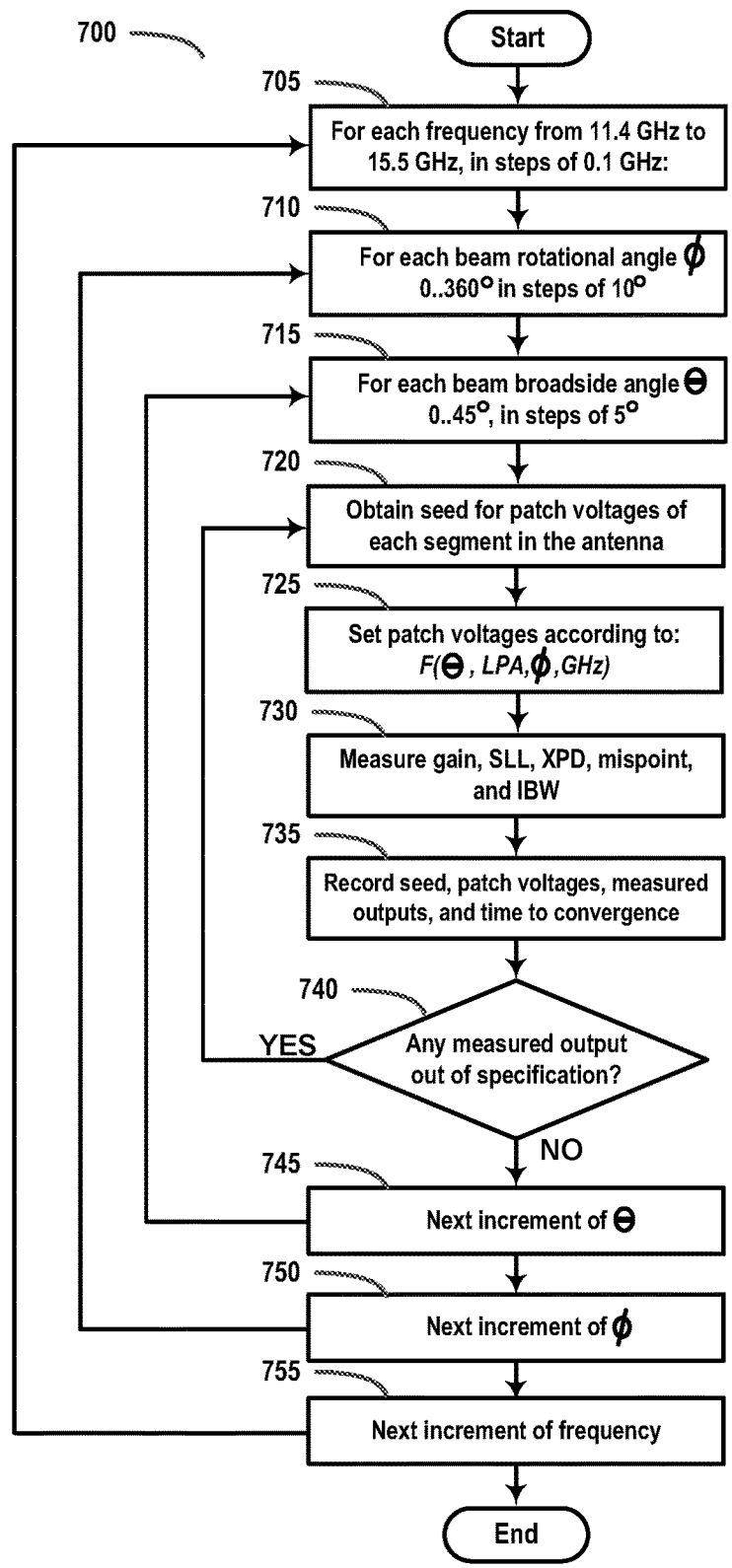
FIG. 7 illustrates a method of optimizing and characterizing a reconfigurable holographic antenna, according to one embodiment.

FIG. 7 illustrates a method 700 of optimizing and characterizing a reconfigurable holographic antenna, according to one embodiment. Manufacturing equipment 290, and/or ASM 200, can include optimization logic that determines patch voltages for each iris/patch combination in segments 405-X of the antenna aperture for each steering angle, Θ, and rotation angle, ϕ, and each fundamental frequency, in GHz, for the antenna 200. Steering angle Θ is measured with reference to broadside is normal to the plane of the antenna aperture. The angle of rotation ϕ is measured with reference to a fixed point on the antenna aperture. The patch voltages determine a modulation pattern that steers the beam at the each set fundamental frequency. A proprietary algorithm generates the patch voltages as a function, $f$ (Θ, LPA, ϕ GHz), where LPA is the linear polarization angle of the steered beam. Method 700 is described with reference to certain loop control variables and increments. One of skill in the art understands that the loop control variable values and increments are by way of example and not limitation. In the case of the beam steering angle Θ being 0° (essentially identical to the broadside line), the rotational angle ϕ need not be iterated.

In operation 705, method operations 705 through 755 are iterated for each fundamental frequency from 11.4 GHz to 14.5 GHz, in increments of 0.1 GHz (100 MHz).

In operation 710, method operations 710 through 750 are iterated for each beam rotational angle from 0° to 360° in increments of 10°. One of skill in the art understands that the rotational angel ϕ need not be iterated for steering angle Θ=0°.

In operation 715, method operations 715 through 745 are iterated for each steering angle from 0° to 45° in increments of 5°.

In operation 720, a seed value is received for a patch voltage generating function, $f$. In an embodiment, the seed value may vary depending upon the resonance peak values, $Peak_1$ and $Peak_2$, of the segments according to the free space test, described above with reference to FIGS. 5A and 5B.

In operation 725, patch voltages are determined from proprietary modulation pattern generation function, $f$ (Θ, LPA, ϕ GHz). The determined patch voltages are applied to the patches and the antenna modulation pattern is generated in response to the applied patch voltages.

In operation 730, properties of the generated steered beam of the reconfigurable holographic antenna are measured, including gain of the beam, side load level (SLL), cross-polarization discrimination (XPD), mispoint, and instantaneous bandwidth (IBW).

In operation 735, the seed value, patch voltages, gain, SLL, XPD, mispoint, and IBW values, along with a time stamp, are all recorded in server 250 storage. The time stamp can be used to determine a time-to-convergence to specification values of the optimization algorithm, $f$ (Θ, LPA, ϕ GHz), based upon the initial, and subsequent, seed values.

In operation 740, it can be determined whether any of the above measured values are out of specification. If so, then method 700 continues at operation 720 where a new seed value is obtained for the optimization function $f$. Otherwise, method 700 continues at operation 745.

In operation 745, if Θ is less than its maximum loop control value, then Θ is incremented and method 700 continues at operation 715. Otherwise, in operation 750, if ϕ is less than its maximum loop control value, then ϕ is incremented and method 700 continues at operation 710. Otherwise, if frequency is less than its maximum loop control value, then frequency is incremented and method 700 continues at operation 705. Otherwise, method 700 ends.

Figure 8:
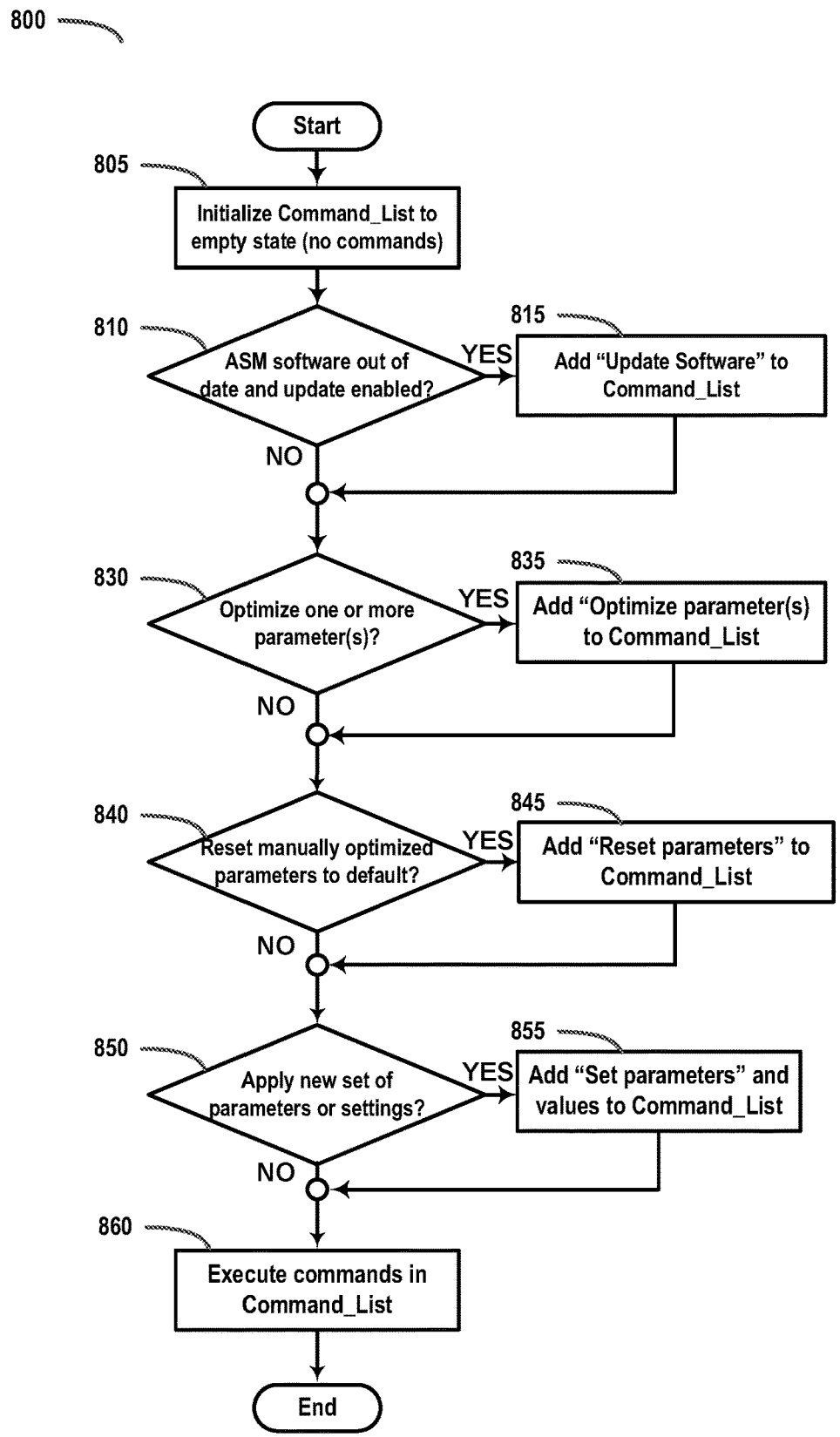
FIG. 8 illustrates a method of updating the software or configuration of an antenna subsystem module and the holographic pattern of a reconfigurable holographic antenna, according to some embodiments.

FIG. 8 illustrates a method 800 of updating the software or configuration of an antenna subsystem module of a reconfigurable holographic antenna, according to some embodiments. An antenna subsystem module (ASM) 200 of a reconfigurable holographic antenna can request that a server 250 provide certain updates to ASM 200, in response to a request by ASM 200 for such an update. Management server 250 can determine whether or not ASM 200 needs such an update. Management server 250 informs ASM 200 that it needs one or more updates, in the form of a command list of updates or functions to perform. ASM 200 command processor 230 can receive the command list from management server 250, and execute each command by requesting the update specified in the command from management server 250. ASM 200 establishes a Transport Layer Security (TLS) session with management server 250 to receive the update in the form of one or more downloaded portions, in accordance with ASM 200 command processor 230. As each portion is downloaded to ASM 200, ASM 200 receives, decrypts, and verifies the portion, and sends a message to management server 250 that such portion has been received and verified. When all portions are downloaded, ASM 200 command processor 230 installs the update in ASM 200 storage.

In operation 805, a command list can store one or more commands for transmission to an ASM by management server 250. The server 250 can initialize the command list empty. The command list can be a data structure such as a linked list of elements, an array of elements, and the elements being text strings or numbers or other data type. The command list can be initialized to empty by setting a count of commands in the command list to zero, by setting each element of a command list data structure to "no data" or null, or by setting command list string to null.

In operation 810, it can be determined by the server 250 whether the control software on the ASM 200 is out of date and whether ASM 200 is enabled to receive software updates. Generally, ASM 200 is enabled to receive software updates. In the event that an ASM 200 has already updated its software to a particular version, and the ASM 200 has rebooted to that version, and the reboot has failed a specified number of times, server 250 can instruct ASM 200 to set itself to disable receipt of future software updates until a later time or event. Server 250 can make this determination by accessing metrics data received from the ASM 200 and analyzed by server 250, or by looking up previous metrics data or other data associated with this particular ASM 200 in ASM configuration and performance database 260, and comparing the software version for this ASM 200 with a latest version of software available for this ASM 200. If the latest version of software is newer than the version currently running in the active partition of this ASM 200, then method 800 continues at operation 815, otherwise method 800 continues at operation 830.

In operation 815, server 250 adds the "update software" command to the command list.

In operation 830, it can be determined whether server 250 has stored an indication that this ASM 200 should self-optimize one or more parameters. The indication may have been placed in the server 250, for this ASM 200, by a remote service technician. The self-optimization logic in ASM 200 can be the same self-optimization logic as contained in test equipment 290 for performing method 700. In an embodiment, the self-optimization logic in the ASM 200 can be the same logic that a user could trigger manually on the antenna. If an indication that self-optimization should be performed is stored in server 250, then in operation 835 the "Optimize parameter(s)" command can be added to the command list.

In operation 840, it can be determined whether the configuration parameters of the ASM 200 need to be reset to previous, or default, values. By analyzing one or more metrics for the ASM, received from the ASM and/or stored in the ASM configuration performance database 260, server 250 can determine that a user has manually optimized one or more configuration variables of the ASM 200 and can further determine that performance has degraded as a consequence of the manually changed configuration parameters. The server 250, or a technician, can determine that the configuration parameters should be reset to previous values or default values. If so, then in operation 845 the command "reset parameters" can be added to the command list. In an embodiment, additional data for the command can include specifying one or more particular parameters that are to be reset, rather than resetting all parameters.

In operation 850, it can be determined whether to set one or more parameters to a certain value. If so, then in operation 855 the "set parameters" command, and any necessary additional data, should be added to the command list. New values for one or more configuration parameters may have been determined to yield better performance for the electrically steered antenna coupled to ASM 200. One or more configuration parameters can be set using the "set parameters" command and additional data, such as the particular In operation 860, ASM 200 command processor 230, in conjunction with management server 250, can execute the commands in the command list.

Figure 9:
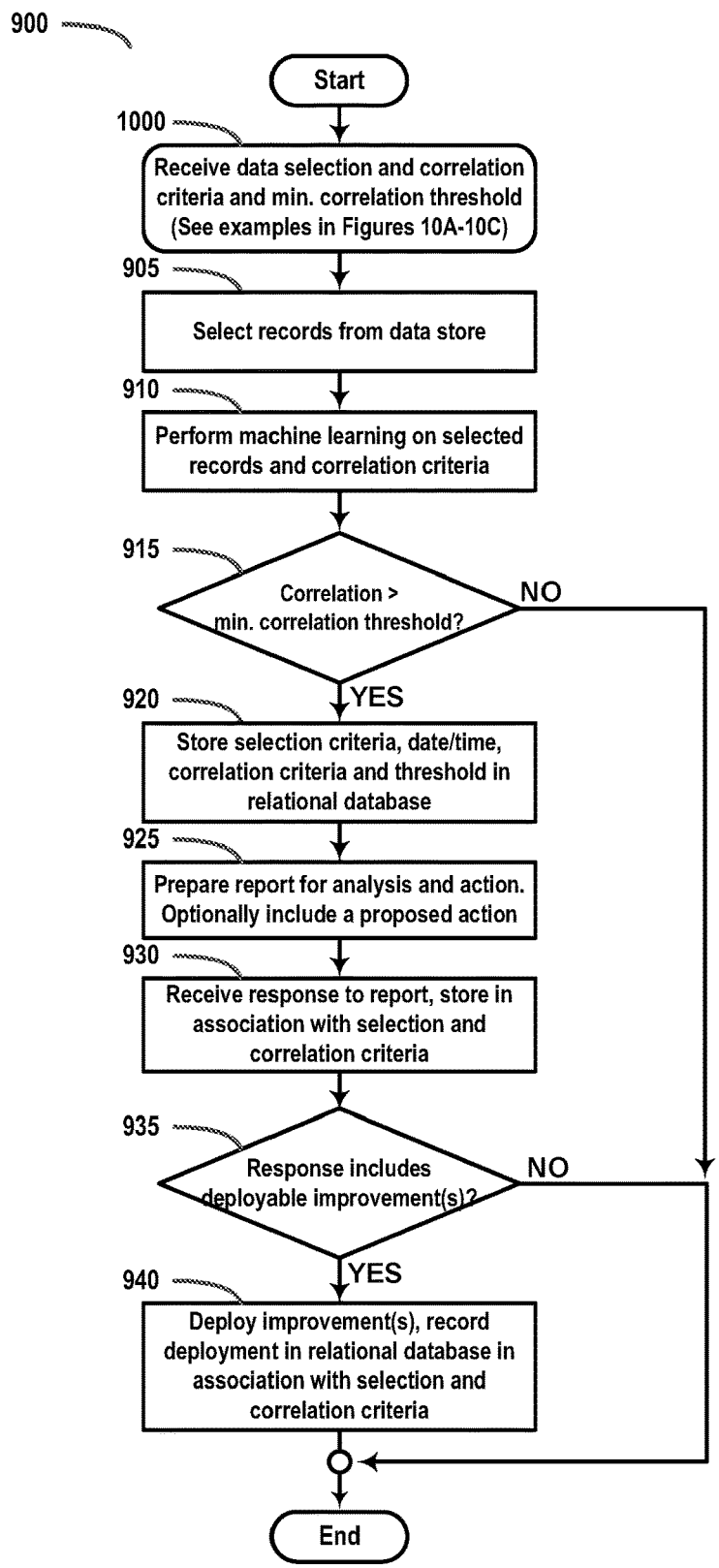
FIG. 9 illustrates a method of using machine learning on manufacturing test data and data regarding updates to configuration and software of deployed reconfigurable holographic antennas, according to an embodiment.

FIG. 9 illustrates a method 900 of using machine learning on manufacturing test data and deployed device data regarding updates to configuration and software of deployed reconfigurable holographic antennas, according to an embodiment.

In operation 1000, machine learning module 265 can receive selection criteria for manufacturing test data and deployed device data (collectively, "device data") stored in server 250, ASM configuration and performance database 260. The selection criteria determine the device data records that are to be included in a specific instance of machine learning. Machine learning module 265 can also receive correlation criteria for correlating the selected records in accordance with the correlation criteria. Machine learning module 265 can also receive a minimum correlation threshold that indicates how much correlation of the selected records to the correlation criteria indicates that the requested correlation has been met. In an embodiment, machine learning module 265 can also receive a proposed improve that to a process, software, configuration, algorithm, or other parameter if the minimum correlation threshold is met or exceeded. Operation 1000 is described in detail, below with reference to FIGS. 10A through 10C.

In operation 905, machine learning module 265 can select records from ASM configuration and performance database 260 according to the received selection criteria.

In operation 910, machine learning module 265 can perform machine learning on the selected records in accordance with the received correlation criteria. In an embodiment, machine learning can include linear regression, Bayes, Naïve Bayes, supervised, or unsupervised learning.

In operation 915, it can be determined whether the machine learning resulted in a correlation of the selected records to the correlation criteria, meeting or exceeding the minimum threshold of correlation. If so, then method 920 continues at operation 920, otherwise method 900 ends.

In operation 920, machine learning module 265 can store the selection criteria, correlation criteria, minimum correlation threshold value, actual correlation value, and a date/time stamp in server 250 storage. In an embodiment, machine learning module 265 can further store the specific list of selected records used by the machine learning module 265.

In operation 925, machine learning module 265 can prepare a report of the requested machine learning task, including the selection criteria, the correlation criteria, the minimum correlation threshold, the actual correlation value, date/time stamp, operator who requested the machine learning task, a proposed improvement based upon the results of the machine learning task, and other data. The report can be stored in server 250, and/or transmitted to the operator who requested the machine learning task, and other specified recipients.

In operation 930, a response to the report generated, stored, and transmitted in operation 925 can be received by server 250. The response may be documentation and analysis by engineering, manufacturing, field reports, field support, or other data related to the machine learning task. The response can be stored in the server 250 in association with the machine learning task report and task.

In operation 935, in can be determined whether the response includes deployable improvements. If so, then in operation 940, the improvement(s) can be deployed. The deployment can be recorded in server 250 in association with the machine learning task, report, and other data.

Figure 10A:
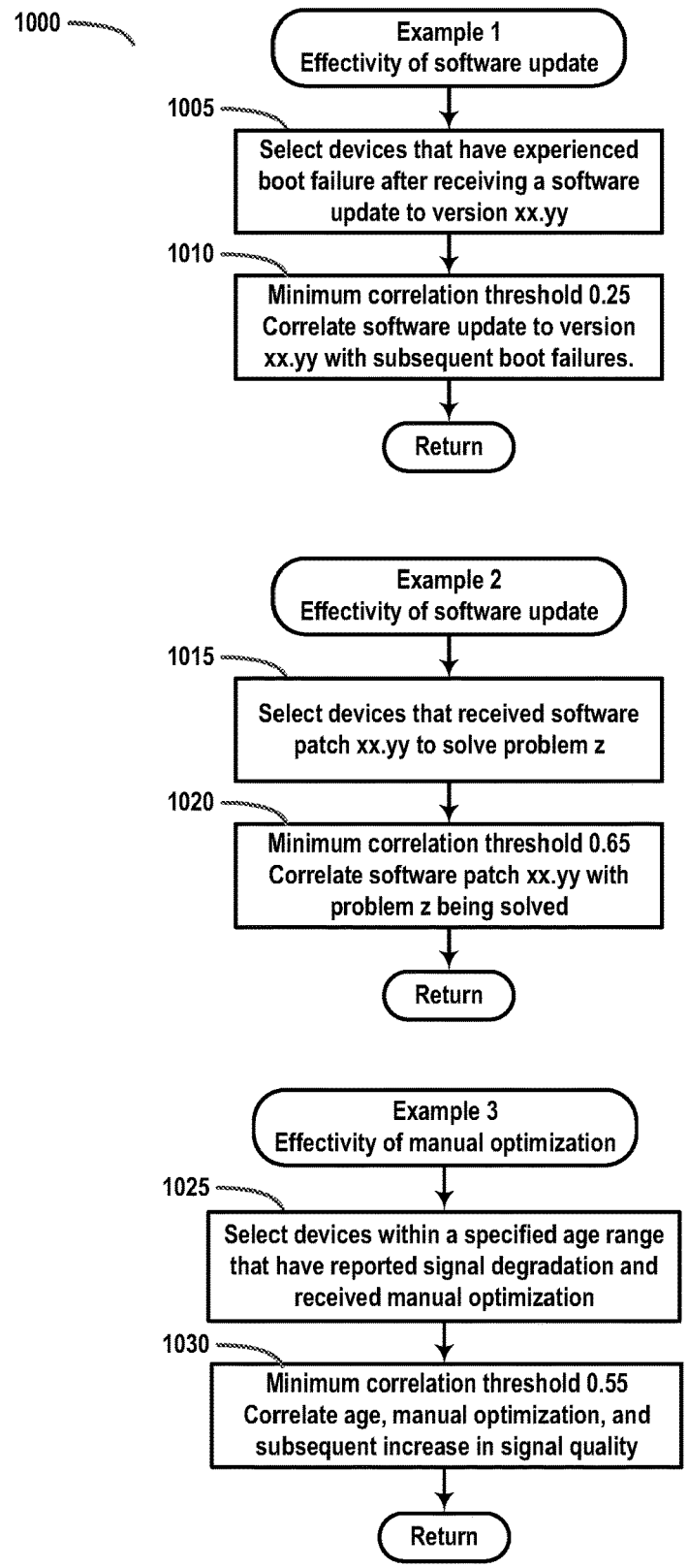
FIGS. 10A through 10C illustrate example query criteria and correlation criteria for use by a machine learning method as described in FIG. 9, according to an embodiment.

FIGS. 10A though 10C illustrate example query criteria and correlation criteria 1000 for use by a machine learning method 900 as described above in FIG. 9, according to an embodiment. The examples are illustrative, and non-limiting.

Referring to FIG. 10A, Example 1 illustrates a machine learning task to determine whether a particular software update has failed to boot frequently. In operation 1005, selection criteria can include selecting device data for devices that have received a software update xx.yy and subsequently experienced boot failure. When ASM 200 receives a software update from server 250, ASM 200 installs the software update and reboots itself to activate the software update. If the reboot fails, the ASM 200 reboots to its previous version of software (prior to the update). During a later check-in process, ASM 200 sends metrics data to server 250 indicating the currently active software. Server 250 can look up the software version last requested by ASM 200 and detect that the currently active software version on the ASM 200 is older than the last requested software version, and that therefore the ASM 200 experienced a boot failure. Records of such failure are stored in ASM configuration and performance data base 260 and selected by the above selection criteria.

In operation 1010, machine learning module 265 can also receive selection criteria, in this case whether the software version xx.yy is correlated to subsequent boot failures. Machine learning module 265 can also receive a minimum correlation threshold value that the requestor of this machine learning task is looking for. Method 1000 returns to method 900, which executes the machine learning task.

Example 2 is directed to determining whether a specified software patch, xx.yy, solves an identified problem z. In operation 1015, selection criteria specify devices that have received software patch xx.yy in order to solve problem z. Problem z may have been previously reported to a support technician. Support technician may have requested that patch xx.yy be installed to correct problem z. Records of the report of problem z, and request for installation of patch xx.yy, and installation of patch xx.yy, are stored in ASM configuration and performance database 260. In operation 1020, machine learning module 265 can also receive correlation criteria indicating that machine learning module 265 is to correlate the selected records to determine whether software patch xx.yy solved problem z to the minimum correlation threshold of 0.65. Method 1000 returns to method 900 which executes the machine learning task.

Example 3 is directed to determining whether manual optimization of antenna parameters is correlated with improved antenna performance. In operation 1025, Machine learning module 265 can receive selection criteria specifying device data for devices that have had one or more configuration or operating parameters optimized by a manual optimization process being run on ASM 200. In operation 1030, machine learning module 265 can also receive correlation criteria indicating that machine learning module 265 is to correlate the selected records to determine whether manual optimization improved signal quality to the minimum correlation threshold of 0.55. Method 1000 returns to method 900 which executes the machine learning task.

Figure 10B:
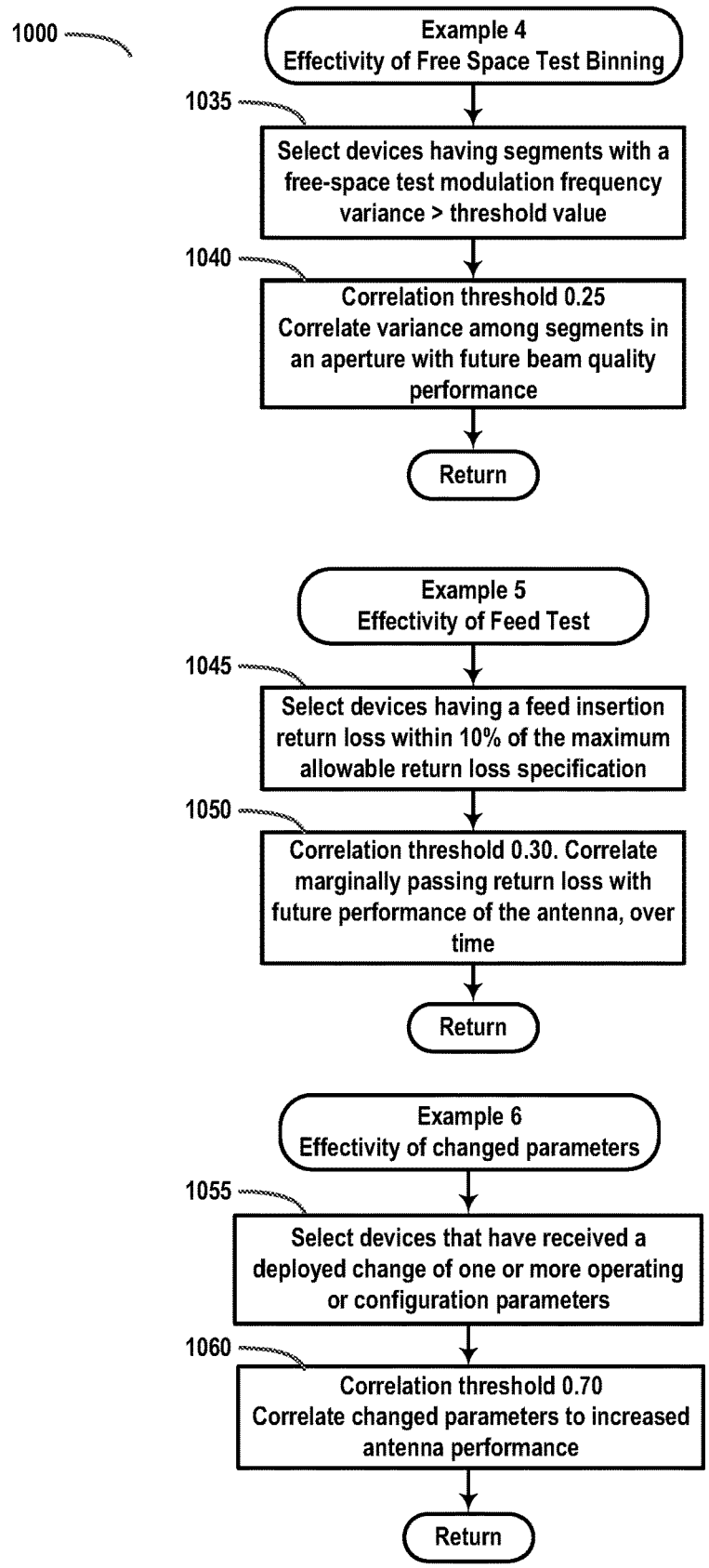

Referring now to FIG. 10B, example 4 is directed to determining whether criteria for the tolerance range on peak resonant frequencies for binning of aperture segments 405-X (two peak frequencies, a dB value for each, within a tolerance) correlates with future performance, in accordance with the free space test, correlates in acceptable beam quality over time. This machine learning task tries to determine whether the binning specification for segments 405-X, e.g. frequency range for a particular bin, needs to be modified. In operation 1035, machine learning module 265 can receive selection criteria specifying device data for the two peak resonant frequencies, and a tolerance range, for a specified segment bin, and all devices that have that were manufactured using segments having that binning range. In operation 1040, machine learning module 265 can also receive correlation criteria indicating that machine learning module 265 is to correlate the selected records to determine whether a variance from the specified resonant peak, greater than a threshold amount, correlates to a trend in future beam quality, over time, to the minimum correlation threshold of 0.25. Method 1000 returns to method 900 which executes the machine learning task.

Example 5 is directed to determining whether a return loss value of the feed insertion point 415, that is within a tolerance value of the maximum allowable return loss (less than −15 dB) correlates to future antenna performance, over time. If so, it could mean that a tighter tolerance may be needed. In operation 1045, machine learning module 265 can receive selection criteria specifying device data for devices that have been manufactured using a feed 410 having a feed insertion point 415 return loss value that is within a threshold value of the maximum allowable return loss, as indicated by the feed test. In operation 1050, machine learning module 265 can also receive correlation criteria indicating that machine learning module 265 is to correlate the selected records to determine whether the feed insertion point 415 return loss being with a threshold value of the maximum specification correlates to degradation in performance over time to the minimum correlation threshold of 0.30. Method 1000 returns to method 900 which executes the machine learning task.

Example 6 is directed to determining whether changing one or more operating or configuration parameters of the ASM 200 is correlated with improved antenna performance. In operation 1055, machine learning module 265 can receive selection criteria specifying device data for devices that have had one or more configuration or operating parameters changed by server 250. In operation 1060, machine learning module 265 can also receive correlation criteria indicating that machine learning module 265 is to correlate the selected records to determine improved antenna performance, over time, to a correlation threshold of 0.70. Method 1000 returns to method 900 which executes the machine learning task.

Figure 10C:
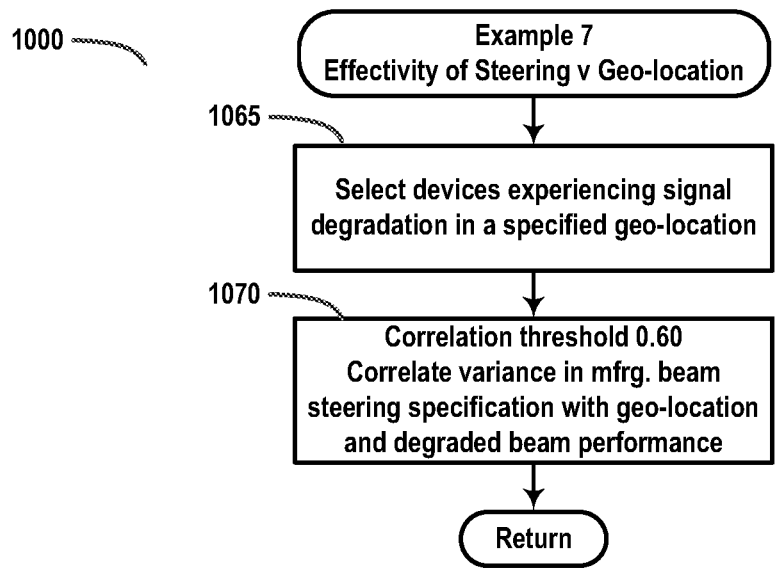

Referring now to FIG. 10C, example 7 is directed to determining whether a threshold variance in adherence to a beam steering specification is a cause of degraded beam performance in a particular geo-location. In operation 1065, machine learning module 265 can receive selection criteria specifying device data for devices that have a beam steering specification that is above a threshold variance from an ideal specification. In operation 1070, machine learning module 265 can also receive correlation criteria indicating that machine learning module 265 is to correlate the selected records to beam degradation a particular geo-location to the minimum correlation threshold of 0.60. Method 1000 returns to method 900 which executes the machine learning task.

Figure 11:
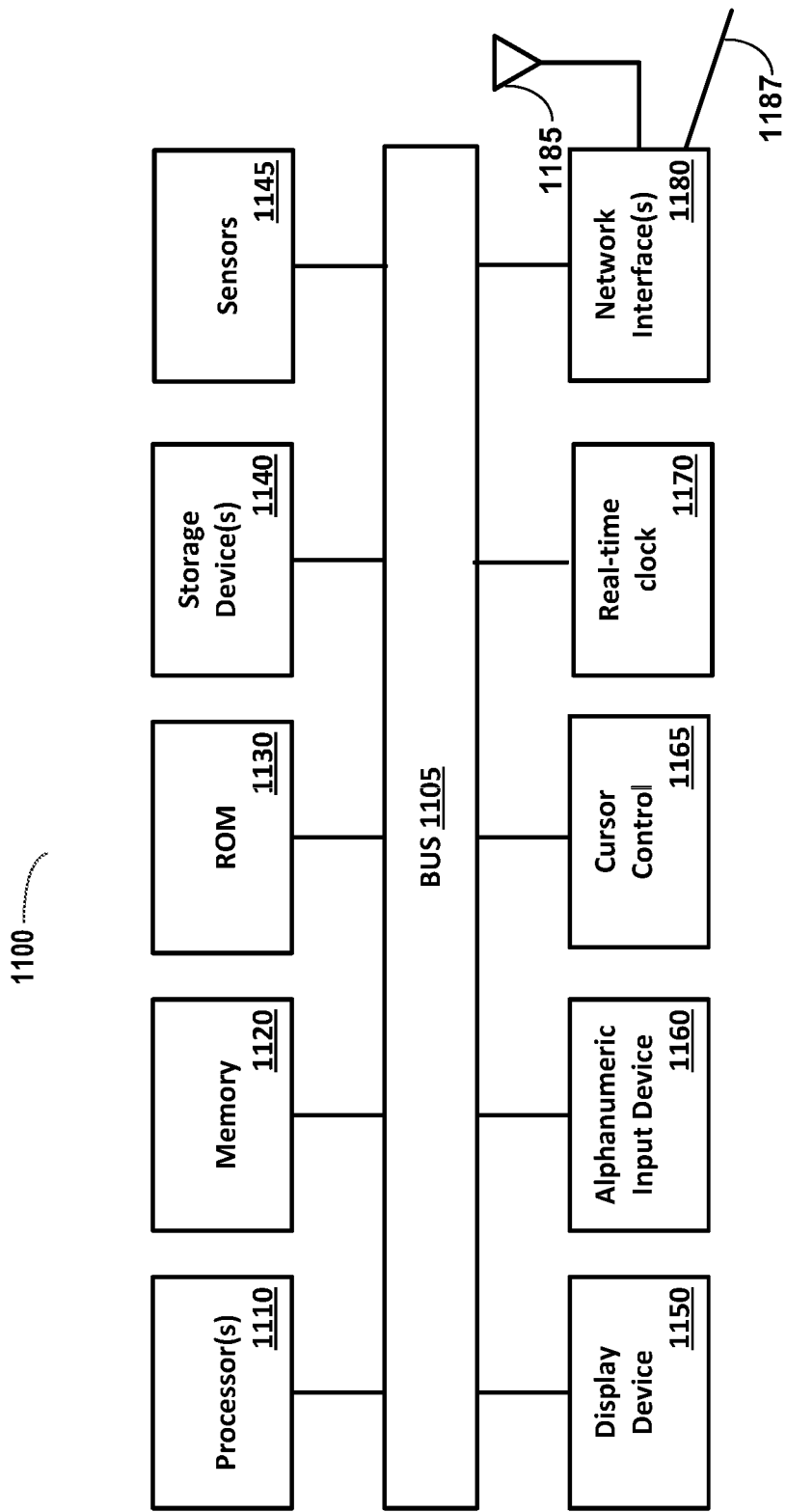
FIG. 11 illustrates an exemplary computing system for implementing the embodiments described herein, according to an embodiment.

FIG. 11 is a block diagram of one embodiment of a computing system 1100. Computing system 1100 can be used to implement the above-described computer system for a technician, a combiner 201, an antenna subsystem module 200, or a server 250. Not all of the below-described components are required for every embodiment. The computing system illustrated in FIG. 11 is intended to represent a range of computing systems (either wired or wireless) including, for example, desktop computer systems, laptop computer systems, cellular telephones, personal digital assistants (PDAs) including cellular-enabled PDAs, set top boxes, entertainment systems or other consumer electronic devices. Alternative computing systems may include more, fewer and/or different components.

Computing system 1100 includes bus 1105 or other communication device to communicate information, and processor 1110 coupled to bus 1105 that may process information. While computing system 1100 is illustrated with a single processor, computing system 1100 may include multiple processors and/or co-processors 1110. Computing system 1100 further may include random access memory (RAM) or other dynamic storage device 1120 (referred to as main memory), coupled to bus 1105 and may store information and instructions that may be executed by processor(s) 1110. Main memory 1120 may also be used to store temporary variables or other intermediate information during execution of instructions by processor 1110. Memory 1120, ROM 1130, and/or storage devices 1140 can be programmed with executable instructions that, when executed by processor(s) 1110 perform any of the above-described operations and functionality.

Computing system 1100 may also include read only memory (ROM) 1130 and/or other static, non-transitory storage device 1140 coupled to bus 1105 that may store static information and instructions for processor(s) 1110. Data storage device 1140 may be coupled to bus 1105 to store information and instructions. Data storage device 1140 such as flash memory or a magnetic disk or optical disc and corresponding drive may be coupled to computing system 1100.

Computing system 1100 can also include sensors 1145, coupled to bus 1105. Sensors 1145 can include a GPS receiver, a three-axis compass, a 3-axis accelerometer, a 3-axis gyro, a 3-axis magnetometer, and other sensors to provide location and orientation information to processor(s) 1110. An ASM 200 may require some or all of sensors 1145.

Computing system 1100 may also be coupled via bus 1105 to display device 1150, such as a light-emitting diode display (LED), touch screen display, or liquid crystal display (LCD), to display information to a user. Computing system 1100 can also include an alphanumeric input device 1160, including alphanumeric and other keys, which may be coupled to bus 1105 to communicate information and command selections to processor(s) 1110. Another type of user input device is cursor control 1165, such as a touchpad, a mouse, a trackball, or cursor direction keys to communicate direction information and command selections to processor(s) 1110 and to control cursor movement on display 1150. Computing system 1100 may further include a real-time clock 1170. The real-time clock 1170 may be used for generating date/time stamps for data records, computing elapsed time, and other time-keeping functions. A real-time clock 1170 can be a battery-backed chipset with a settable date and time. Alternatively, a real-time clock 1170 may include logic to retrieve a real-time from a network source such as a server or an Internet server via network interfaces 1180, described below. Real-time clock can be used to implement timers in some embodiments.

Computing system 1100 further may include one or more network interface(s) 1180 to provide access to a network, such as a local area network. Network interface(s) 1180 may include, for example, a wireless network interface having antenna 1185, which may represent one or more antenna(e). Computing system 1100 can include multiple wireless network interfaces such as a combination of Wi-Fi, Bluetooth® and cellular telephony interfaces. Network interface(s) 1180 may also include, for example, a wired network interface to communicate with remote devices via network cable 1187, which may be, for example, an Ethernet cable, a coaxial cable, a fiber optic cable, a serial cable, or a parallel cable. Network interfaces may include connectivity to a satellite communication system.

In one embodiment, network interface(s) 1180 may provide access to a local area network, for example, by conforming to IEEE 802.11b, 802.11g, or 802.11n standards, and/or the wireless network interface may provide access to a personal area network, for example, by conforming to Bluetooth® standards. Other wireless network interfaces and/or protocols can also be supported, such as ground-to-satellite communications. In addition to, or instead of, communication via wireless LAN standards, network interface(s) 1180 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A computer-implemented method for improving a process of manufacturing an antenna or improving the antenna, the method; comprising:
    receiving selection criteria for querying a database of configuration and performance information of a plurality of antennas and correlation criteria for performing machine learning on results returned from querying the database;
    in response to receiving query results matching the selection criteria, performing machine learning on the query results according to the correlation criteria that includes a minimum correlation threshold indicating an effectiveness of one or more updates or changes to configuration of the plurality of antennas;
    receiving a proposed improvement to a process of manufacturing an antenna or a proposed improvement to the antenna;
    deploying an improved process of manufacturing the antenna or an improvement to the antenna if the machine learning resulted in correlation of the results returned from querying the database to the correlation criteria meeting or exceeding the minimum correlation threshold.

2. The method of claim 1, wherein the database comprises configuration and performance data of a plurality of manufactured antennas and a plurality of deployed antennas.

3. The method of claim 2, wherein the configuration and performance data of a deployed antenna is updated in response to updating the deployed antenna.

4. The method of claim 1, wherein the query results include both manufacturing testing information and field update information for each of one or more antennas.

5. The method of claim 1, wherein the query results include changes to performance information for each of one or more antennas over a specified period of time.

6. A non-transitory machine-readable medium having instructions stored therein, which when executed by a processor, cause the processor to perform operations for improving a process of manufacturing an antenna or improving the antenna, the operations comprising:
    receiving selection criteria for querying a database of configuration and performance information of a plurality of antennas and correlation criteria for performing machine learning on results returned from querying the database;
    in response to receiving query results matching the selection criteria, performing machine learning on the query results according to the correlation criteria that includes a minimum correlation threshold indicating an effectiveness of one or more updates or changes to configuration of the plurality of antennas;
    receiving a proposed improvement to a process of manufacturing the antenna, or a proposed improvement to the antenna;
    deploying an improved process of manufacturing the antenna or the improvement to the antenna if the machine learning resulted in correlation of the results returned from querying the database to the correlation criteria meeting or exceeding the minimum correlation threshold.

7. The medium of claim 6, wherein the database comprises configuration and performance data of a plurality of manufactured antennas and a plurality of deployed antenna.

8. The medium of claim 7, wherein the configuration and performance data of a deployed antenna is updated in response to updating the deployed antenna.

9. The medium of claim 6, wherein the query results include both manufacturing testing information and field update information for each of one or more antennas.

10. The medium of claim 6, wherein the query results include changes to performance information for each of one or more antennas over a specified period of time.

11. A data processing system, comprising:
a processor; and
a memory coupled to the processor to store instructions, which when executed by the processor, cause the processor to perform operations for improving a process of manufacturing an antenna or improving the antenna, the operations including:
receiving selection criteria for querying a database of configuration and performance information of a plurality of antennas and correlation criteria for performing machine learning on results returned from querying the database;
in response to receiving query results matching the selection criteria, performing machine learning on the query results according to the correlation criteria that includes a minimum correlation threshold indicating an effectiveness of one or more updates or changes to configuration of the plurality of antennas;
receiving a proposed improvement to a process of manufacturing the antenna, or a proposed improvement to the antenna;
deploying an improved process of manufacturing the antenna or the improvement to the antenna if the machine learning resulted in correlation of the results returned from querying the database to the correlation criteria meeting or exceeding the minimum correlation threshold.

12. The system of claim 11, wherein the database comprises configuration and performance data of a plurality of manufactured antennas and a plurality of deployed antennas.

13. The system of claim 12, wherein the configuration and performance data of a deployed antenna is updated in response to updating the deployed antenna.

14. The system of claim 11, wherein the query results include both manufacturing testing information and field update information for each of one or more antennas.

15. The system of claim 11, wherein the query results include changes to performance information for each of one or more antennas over a specified period of time.

* * * * *